United States Patent
Konz et al.

(10) Patent No.: US 7,065,583 B2
(45) Date of Patent: Jun. 20, 2006

(54) SYSTEM AND ASSOCIATED SUPPRESSION ASSEMBLY FOR LIMITING ELECTROMAGNETIC EMISSIONS IN NETWORK DEVICES COMMUNICATING VIA A NETWORK BUS

(75) Inventors: Daniel W. Konz, Florissant, MO (US); Mark D. Rogers, Ballwin, MO (US)

(73) Assignee: The Boeing Company, Seattle, WA (US)

( * ) Notice: Subject to any disclaimer, the term of this patent is extended or adjusted under 35 U.S.C. 154(b) by 686 days.

(21) Appl. No.: 10/076,063

(22) Filed: Feb. 14, 2002

(65) Prior Publication Data

US 2003/0154316 A1 Aug. 14, 2003

(51) Int. Cl.
*G06F 15/16* (2006.01)
(52) U.S. Cl. .................. 709/237; 709/250; 375/346
(58) Field of Classification Search ................ 709/237, 709/250; 375/346
See application file for complete search history.

(56) References Cited

U.S. PATENT DOCUMENTS

| | | | |
|---|---|---|---|
| 4,304,001 A | | 12/1981 | Cope |
| 4,379,327 A | * | 4/1983 | Tietjen et al. .................. 710/61 |
| 4,688,168 A | | 8/1987 | Gudaitis et al. |
| 4,942,571 A | | 7/1990 | Möller et al. |
| 4,969,147 A | | 11/1990 | Markkula, Jr. et al. |
| 4,996,684 A | | 2/1991 | Morley et al. |
| 5,138,709 A | | 8/1992 | Jones et al. |
| 5,223,806 A | * | 6/1993 | Curtis et al. .................. 333/12 |
| 5,274,783 A | | 12/1993 | House et al. |
| 5,316,311 A | * | 5/1994 | Lee .......................... 273/348.4 |
| 5,367,678 A | | 11/1994 | Lee et al. |
| 5,437,060 A | | 7/1995 | Delamater et al. |
| 5,445,128 A | | 8/1995 | Letang et al. |
| 5,511,152 A | * | 4/1996 | Lai et al. .................... 358/1.16 |
| 5,557,634 A | | 9/1996 | Balasubramanian et al. |
| 5,590,369 A | * | 12/1996 | Burgess et al. ............. 710/110 |
| 5,615,404 A | | 3/1997 | Knoll et al. |

(Continued)

FOREIGN PATENT DOCUMENTS

EP 0 562 333 A2 9/1993

(Continued)

OTHER PUBLICATIONS

INFINEON: *C167CR 16-BIT Single-Chip Microcontroller*; Apr. 2000; 72 pages; XP-002201995; Published by Infineon Technologies AG.

(Continued)

*Primary Examiner*—Zarni Maung
*Assistant Examiner*—Van Kim T. Nguyen
(74) *Attorney, Agent, or Firm*—Alston & Bird LLP

(57) ABSTRACT

A network system includes a network having a network bus, such as unshielded differential twisted-pair wires, electrically connected to a plurality of remote devices, and a network controller for digitally directing transmissions with the remote devices via the network bus. The network system also includes a plurality of network device interface elements adapted to interconnect the network controller with respective remote devices via the network bus. Each network device interface element is capable of transmitting and receiving messages via the network bus. And to at least partially limit electromagnetic emissions from the respective network device interface element and/or the respective remote device, each network device interface element includes a suppression assembly. Additionally, each network device interface element can include a transceiver and a processing element, with the suppression assembly electrically connected between the transceiver and the network bus.

35 Claims, 5 Drawing Sheets

U.S. PATENT DOCUMENTS

| | | | |
|---|---|---|---|
| 5,623,610 A | | 4/1997 | Knoll et al. |
| 5,640,585 A | * | 6/1997 | Smoot et al. ............... 712/38 |
| 5,646,368 A | * | 7/1997 | Muyshondt et al. ........... 174/33 |
| 5,671,249 A | * | 9/1997 | Andersson et al. ......... 375/211 |
| 5,694,555 A | | 12/1997 | Morriss et al. |
| 5,737,356 A | | 4/1998 | Harrison et al. |
| 5,742,847 A | | 4/1998 | Knoll et al. |
| 5,801,602 A | * | 9/1998 | Fawal et al. ............... 333/177 |
| 5,809,027 A | | 9/1998 | Kim et al. |
| 5,909,556 A | | 6/1999 | Morriss et al. |
| 5,978,875 A | | 11/1999 | Asano et al. |
| 6,134,485 A | | 10/2000 | Tanielian et al. |
| 6,195,724 B1 | | 2/2001 | Stracovsky et al. |
| 6,273,771 B1 | | 8/2001 | Buckley et al. |
| 6,452,938 B1 | * | 9/2002 | Fawal et al. ............... 370/463 |

FOREIGN PATENT DOCUMENTS

| | | |
|---|---|---|
| WO | WO 99/63409 | 12/1999 |
| WO | WO 00/62501 | 10/2000 |
| WO | WO 02 46938 A | 6/2002 |

OTHER PUBLICATIONS

Tobias Wenzel; INFINEON: *CAN Baudrate Detection with Infineon CAN Devices*; Jul. 1999, 11 pages; XP-002201996.

PCT Notification of Transmittal of the International Search Report, PCT International Search Report for PCT/US02/13190 (filed Apr. 26, 2002).

PCT Notification of Transmittal of the International Search Report, PCT International Search Report for PCT/US02/13246 (filed Apr. 26, 2002).

PCT Notification of Transmittal of the International Search Report, PCT International Search Report for PCT/US02/13303 (Field Apr. 26, 2002).

PCT Notification of Transmittal of the International Search Report; PCT International Search Report for PCT/US02/13366.

PCT Notification of Transmittal of the International Search Report, PCT International Search Report for PCT/US02/13367 (Filed Apr. 26, 2002).

PCT Communication Relating to the Results of the Partial International Search for PCT/US/01/47393.

Robert Patzke; *Fieldbus basics*; 1998; pp. 275-293; Computer Standards & Interfaces 19 (1998); Elsiver Sciences B.V.

INTERSIL; *HE-15531 CMOS Manchester Encoder-Decoder*; Internet article, Mar. 1997; XP002298816; available at <http://www.intersil.com/data/fn/fn2961> (visited Sep. 29, 1998).

G.I. Gotlib, V. Ya. Zagurskii; *Decoding Techniques in Coaxial-Cable-Based Local-Area Networks*; 1989; pp. 47-54; vol. 23, No. 2; Automatic Control and Computer Sciences; Allerton Press, Inc.

Tobias Wenzel; *CAN Baudrate Detection with Infineon CAN devices*; Jul. 1997; 11 pages; Infineon Technologies; Microcontroller Division; XP002201996.

*IEEE Standard for a Smart Transducer Interface for Sensors and Actuators—Transducer to Microprocessor Communication Protocols and Transducer Electronic Data Sheet (TEDS) Formats*; Sep. 1998; 122 pages; IEEE Instrumentation and Measurement Society; IEEE Std 1451.2-1997; ISBN 1-55937-963-4.

H. Kopetz; *TTP/A Protocol—Specification of the TTP/A Protocol*; TTTech Computertechnik AG, Time-Triggered Technology; May 16, 2001; pp. 1-35; XP-002254182.

H. Kopetz, G. Grundsteidl; *TTP—A Time-Triggered Protocol for Fault-Tolerant Real-Time Systems*; Fault-Tolerant Computing; FTCS-23; Digest of Papers, the Twenty-Third International Symposium on Toulouse, France Jun. 22-24, 1993, Los Alamitos, California; 1993; pp. 524-533; XP010251368; ISBN: 0-8186-3680-7.

T.W. Martin; *1394: High Performance Serial Bus for Desktop and Portable Computers*; Computer Technology Review; 1994; pp. 46-49; Supplement No. 6, vol. 14; XP000451486; ISSN: 0278-9647; Westworld Production Co., Los Angeles, California.

* cited by examiner

SYSTEM AND ASSOCIATED SUPPRESSION ASSEMBLY FOR LIMITING ELECTROMAGNETIC EMISSIONS IN NETWORK DEVICES COMMUNICATING VIA A NETWORK BUS

FIELD OF THE INVENTION

The present invention relates generally to systems and methods for network communications and, more particularly, to systems and methods for limiting electromagnetic emissions in network devices communicating in a network.

BACKGROUND OF THE INVENTION

As systems, such as the multimedia entertainment, communications and diagnostic systems utilized by the automotive and aerospace industries, become more complex, a need arises for additional devices to communicate, either with each other or with a central controller or the like. Historically, these systems included dedicated wiring extending between the various devices in order to support communications therebetween. As systems have become more integrated and the communications requirements have been increased, the amount of dedicated wiring that would be required can quickly become excessively large, both in terms of the space required for the wiring and the cost of the wiring and the attendant installation. Moreover, as the amount of dedicated wiring increases, the overall complexity of the system also generally increased as well as the likelihood that some portion of the wiring might be damaged or broken during or following installation.

As such, network buses have been developed to provide a common communications path between a plurality of devices. In automotive and aerospace applications, for example, a network bus can be utilized to monitor various components and to collect diagnostic and status information. In this regard, diagnostic and status information relating to the strain, acceleration, pressure and/or temperature to which the various components are subjected may be collected and analyzed. By way of further example, a network bus architecture is currently being developed to support communications and the delivery of multimedia information to the occupants of a vehicle, such as an automobile, minivan, sports utility vehicle, aircraft, boat or the like. Advantageously, this network bus would transport the audio signals, including streaming audio signals, produced by one or more of a radio, a cassette tape player, a compact disc player or the like to selected speakers or headphone jacks throughout the vehicle. Similarly, the network bus may support voice and data communications with a cellular telephone carried by an occupant of the vehicle, as well as communications with a laptop computer, a handheld computing device or the like. Also, the network bus may transmit video signals, including streaming video signals, from a television receiver, a videocassette recorder or other video source to one or more video monitors. In addition, the network bus may transmit sensor and actuator signals to and from devices such as drivetrain devices, passive restraint devices, crash avoidance devices, drive-by-wire devices, or the like.

In addition to the variety of devices that are connected to a network bus, one or more controllers are also generally connected to the network bus for receiving data from the various devices and for sending commands to the devices. Among other things, these commands specify the manner in which the various devices are to function including the manner in which the various devices are to transmit information over the network bus. Additionally, the controller(s) can receive input from an operator, such as an occupant of the vehicle. This input can include, for example, an indication of the source(s) of the signals to be transmitted over the network bus as well as the destination of the signals.

Traditionally, networks of the type described above have transmitted data in analog format. Unfortunately, analog signals are susceptible to noise introduced into the signals during data transmission. Given that many of the transmitted signals have a low amplitude to start with, this noise can corrupt the signal and decrease the signal to noise ratio to levels that cause loss of resolution in the signal. Further, as many of these network devices are scattered some distance from the controller, the electrical lines connecting the network devices to the controller may be sufficiently long to cause signal degradation due to DC resistance in the wiring.

In light of these shortcomings, it would be advantageous to utilize digital networks. But, many conventional digital networks suffer from a variety of problems themselves. For example, many existing digital networks operate according to complicated protocols which require each network device to have a relatively high level processor, thereby increasing the cost of the network devices. Complicated protocols also introduce overhead into the messages on the bus that are not necessary for data acquisition and control. This overhead can severely limit the number of data samples that can be transmitted on the bus. These networks also have other problems. For example, they generally do not support both acquisition and control, and they typically only support networks that extend over relatively short lengths. Further, these networks typically have bulky network device interfaces, slow network communication rates and/or a low network device count. Additionally, many computer systems that include digital networks do not operate in a time-deterministic manner. As such, these computer systems generally lack the capability to schedule a trigger command to the network components that repeats or is interpreted and executed with any precision timing.

Regardless of the digital or analog nature of the network, many networks suffer from a level of electromagnetic emissions. In this regard, everything else being equal, the lower the electromagnetic emissions of the network, the lower the probability that the network will interfere with other electronic functions of the system employing the network. Generally, however, transmission mediums tend to exhibit characteristics of antennas as the frequency of the carrier signals increase and, as such, electromagnetic emissions tend to increase. And whereas networks in complex systems such as automotive and aircraft systems have stringent standards for the quality of transmissions, the standards for the quality of transmissions become even more stringent as the carrier frequency increases.

Among the reasons for having stringent standards in complex systems such as automotive and aircraft systems, the communication system must be designed so as to not interfere with the reception in simultaneously operating radio communication systems. And due to the stringent requirements of the communication system, including not interfering with the radio reception, the power spectral density of the electromagnetic emissions from any electronic function on the automobile or aircraft must be extremely low throughout the RF frequency range. Additionally, because networks in many complex automotive and aircraft systems operate via low cost transmission mediums, such as inexpensive twisted-pair cable, the networks must satisfy the electromagnetic emissions requirements with such transmission mediums, unless the entire transmission medium is replaced with a more complex and costly medium, which can be cost prohibitive and result in lower reliability of the network.

SUMMARY OF THE INVENTION

In light of the foregoing background, the present invention provides a system and associated suppression assembly for limiting electromagnetic emissions in network devices communicating via a network bus. The system and associated suppression assembly of the present invention can support communications at transmission rates up to 12.5 Mb/sec or more. Further, the system and associated suppression assembly limit electromagnetic emissions to at or below stringent standards, such as those instituted in the automotive and aircraft industries, while communicating via a network bus comprising an unshielded twisted-pair cable.

According to one aspect of the present invention, a network system includes a network having a network bus, such as unshielded differential twisted-pair wires, electrically connected to a plurality of remote devices, and a network controller for digitally directing transmissions with the remote devices via the network bus. The network controller can be capable of selectively operating in either a synchronous mode or an asynchronous mode. As such, the network controller can transmit messages and clock signals via the network bus in the synchronous mode. Alternatively, the network controller can transmit messages in the asynchronous mode via the network bus at a predetermined bit rate without any accompanying clock signals.

In addition to the network bus and the network controller, the network system includes a plurality of network device interface elements adapted to interconnect the network controller with respective remote devices via the network bus. Each network device interface element is capable of transmitting and receiving messages via the network bus. Also, each network device interface element is capable of determining if clock signals are provided with messages received via the network bus such that the network device interface can transmit messages in either a synchronous mode or an asynchronous mode based upon the determination.

To at least partially limit electromagnetic emissions from the respective network device interface element and/or the respective remote device, each network device interface element includes a suppression assembly. Additionally, each network device interface element can include a transceiver and a processing element, with the suppression assembly electrically connected between the transceiver and the network bus. The transceiver is capable of transmitting and receiving messages via the network bus. And the processing element is capable of providing commands to the associated remote device in response to messages received by the transceiver and for receiving data from the associated remote device. To limit noise generated by the transceiver, the system can also include at least one resistor electrically connected between the transceiver and the processing element.

The suppression assembly comprises at least one of an isolation transformer, a common mode choke and a low pass filter. In one embodiment, the isolation transformer includes a primary coil located proximate a respective network device and a secondary coil located proximate the network bus, where the primary coil and secondary coil include a primary center tap and a secondary center tap, respectively. In this regard in embodiments where the suppression assembly includes the isolation transformer, the suppression assembly can further include a low impedance capacitor electrically connected between the primary center tap and a ground, as well as a resistor electrically connected between the secondary center tap and the ground. In this regard, in embodiments including at least the isolation transformer and the common mode choke, the common mode choke is electrically connected between the isolation transformer and the network bus. And in embodiments including the isolation transformer, common mode choke and low pass filter, the low pass filter is electrically connected between the transceiver and the isolation transformer.

In one advantageous embodiment, each network device interface element further includes a printed circuit board upon which the elements of the network device interface element are mounted. In this regard, the printed circuit board can comprise a plurality of layers, including at least one signal layer, a power layer and a ground layer. To electrically connect a conductive trace on a signal layer extending from the transceiver with the power layer, the printed circuit board defines at least one via between at least two layers. To reduce electromagnetic emissions caused by such a configuration, each network device interface element can further comprise a noise suppression assembly, such as a ferrite chip bead with a capacitor and/or an LC low pass filter network, electrically connected to the conductive trace extending from the transceiver on the signal layer. Further, to provide a lossy path for noise on the power layer, the network system can also include a damping resistor and a capacitor connected in series with one another and electrically connected between the power layer and the ground layer.

In embodiments where the network device interface elements include printed circuit boards, the network system further includes a plurality of shielding enclosures each defining an internal cavity. In this regard the internal cavities contain respective printed circuit boards such that the respective shielding enclosures are capable of preventing at least a portion of electromagnetic emissions from the respective network device interface elements from escaping the internal cavities. Also, to further prevent electromagnetic emissions from escaping a respective internal cavity, each shielding enclosure can include at least one grounding element electrically connected between at least one edge of the respective printed circuit board and the shielding enclosure.

Therefore, the present invention provides a system and associated suppression assembly for limiting electromagnetic emissions in network devices communicating via a network bus. The network system, including the network bus, network controller, remote devices, network device interfaces and suppression assemblies, can support communications at transmission rates up to 12.5 Mb/sec or more. Further, the suppression assembly limit electromagnetic emissions to at or below stringent standards, such as those instituted in the automotive and aircraft industries, with a network bus comprising an unshielded twisted-pair cable.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
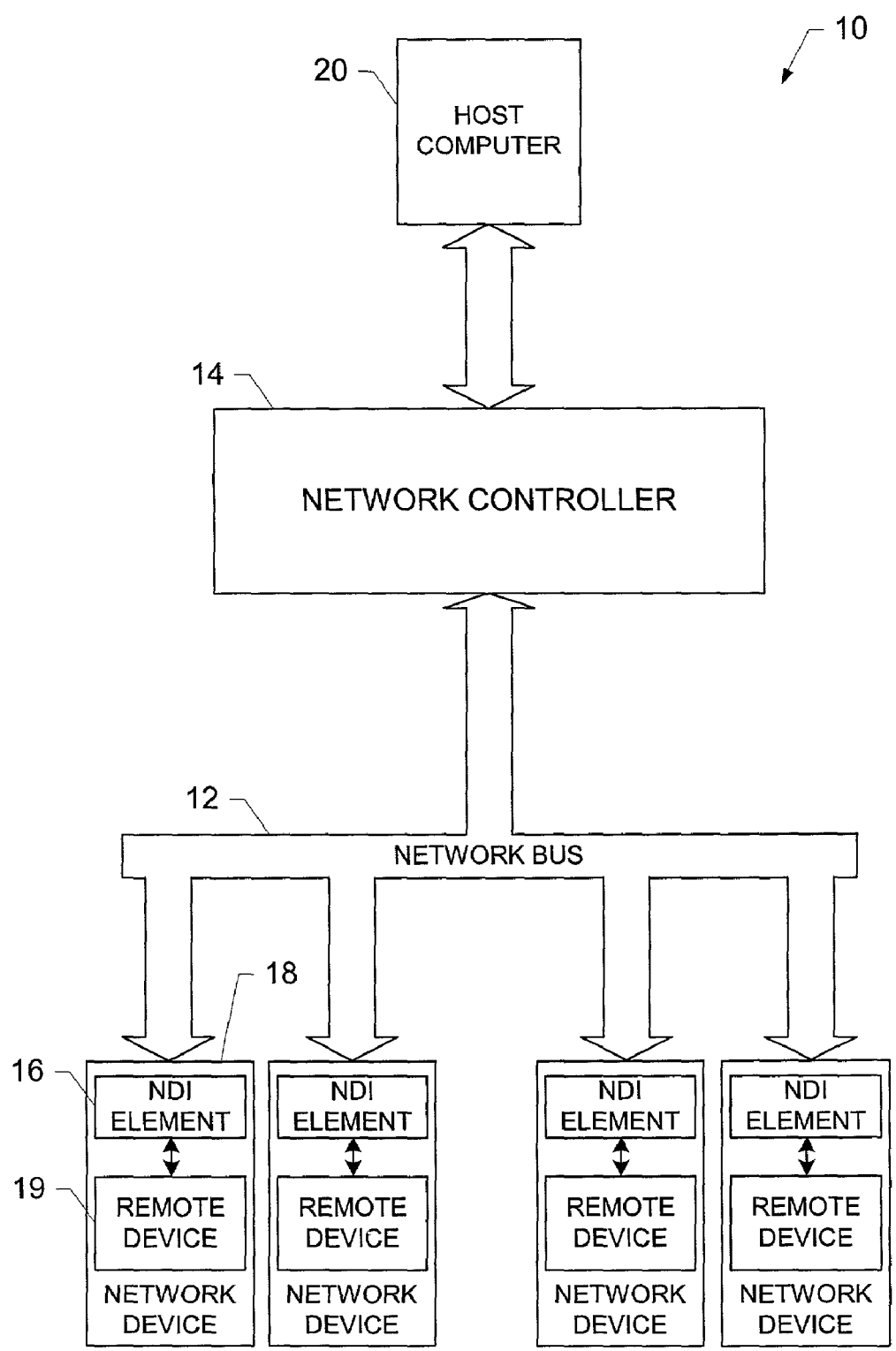
FIG. 1 is a schematic block diagram illustrating a network system that would benefit from the limited electromagnetic emissions afforded by one embodiment of the present invention.

Referring now to FIG. 1, a system 10 that would benefit from the limiting of the electromagnetic emissions afforded by the present invention is depicted. While several embodiments of the system are illustrated and will be hereinafter described for purposes of example, other types of systems can readily employ the benefits afforded by the present invention. Moreover, the system and method of the present invention will be primarily described in conjunction with automotive and aerospace applications, such as automotive and aerospace applications designed to support communications and the delivery of multimedia information to the occupants of a vehicle and/or to monitor various components, to collect diagnostic and status information and provide process control information to sensors and actuators. However, the system and method of the present invention can be utilized in conjunction with a variety of other applications, both in the automotive and aerospace industries and outside of those industries.

As shown in FIG. 1, the system 10 includes a network bus 12 electrically connected to a network controller 14. Whereas, the system illustrated only includes a single network controller, it should be understood that more than one network controller can be utilized, such as for fault tolerance purposes, without departing from the spirit and scope of the present invention. The system depicted in FIG. 1 also includes a plurality of network devices 18 electrically connected to the network bus and, in turn, to the network controller, at different points along the network bus. Thus, the network bus supports communications between the network controller and the network devices, as well as communications between the network devices themselves. In this regard, the system is capable of supporting communications at transmission rates up to 12.5 Mb/sec or more.

The network controller 14 is designed to issue commands to respective network devices 18 and, in at least some instances, to receive data from the network devices. For example, the commands may dictate that a network device provide a particular type of data, such as status or other diagnostic data. Alternatively, the commands issued by the network controller can direct one or more of the network devices to provide signals of a predetermined type, such as audio signals, video signals or the like, and for one or more of the other network devices to receive the signals. Although various types of network controllers can be utilized, one advantageous type of network controller is the network controller described by U.S. patent application Ser. No. 09/736,878 entitled Network Controller for Digitally Controlling Network Devices Via a Common Bus, filed Dec. 14, 2000, the contents of which are incorporated herein by reference.

As described in U.S. patent application Ser. No. 09/736,878 the network controller 14 is capable of selectively operating in either a synchronous or an asynchronous mode. In this regard, the network controller transmits messages and clock signals to the network devices 18 via the network bus 12 in the synchronous mode. And in the asynchronous mode, the network controller transmits messages to the network devices at a predetermined bit rate without any accompanying clock signals. As also described in U.S. patent application Ser. No. 09/736,878, and illustrated in FIG. 1, the network controller may also be disposed in electrical communication with a host computer 20 that generally directs the operation of the network controller and that analyzes data received by the network controller from the network devices.

Various types of network buses 12 can be employed. Typically, the network bus consists of one, two, three or more pairs of wire, such as shielded or unshielded differential twisted-pair copper wires, for transmitting commands, data and other signals. As such, the network bus can be designed to support either a standard half duplex configuration or a full duplex configuration. In some embodiments desiring synchronous communications, one of the pair of wires can be utilized to transmit a clock signal typically from a network controller to the network devices 18. Still further, the network bus can include a pair of power lines, such as power wires, for supplying power and a common ground to the remote devices.

The network devices 18 include, and are associated with, respective remote devices 19 that can include a wide variety of devices; most, if not all, of which are located remote from the network controller 14. For example, the remote devices can include sensors for providing data, such as status or diagnostic data, to the network controller so that the health and/or operation of the network device can be monitored. In an automotive application, for example, the remote devices can include sensors for monitoring the throttle position, the oil pressure, the water temperature, the transmission fluid pressure, the seat position, the antilock brake system, the suspension, the passive restraint system and the steering system, to name but a few. Alternatively, the remote devices may include an actuator for performing a particular fuction in response to a command from the network controller. In the automotive application, for example, the remote devices can include actuators for controlling the throttle position, the anti-lock brake system, the suspension, the passive restraint system and the active suspension system, to name but a few. Still further, the remote devices may include an audio or video source. In this regard, the remote devices can include radio receivers, tape cassette players, compact disc players, and cellular telephone receivers for providing audio signals, including in some instances streaming audio signals, to the network bus. Correspondingly, the remote devices can include speakers, headphone jacks or the like for receiving audio signals from the network bus and for providing a corresponding audible output. Similarly, the remote devices can include a television receiver or a video cassette player providing video signals to the network bus. Accordingly, the remote devices can include a video monitor or the like for receiving the video signals and for displaying images based upon the video signals.

Figure 2:
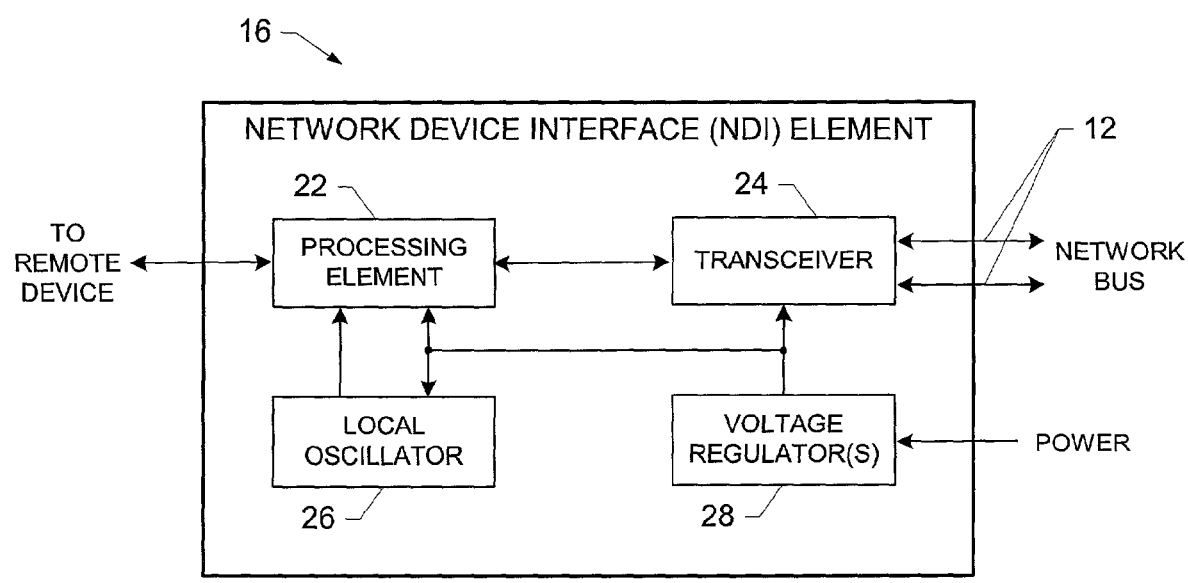
FIG. 2 is an exploded schematic block diagram illustrating various elements of a network device interface element, according to one embodiment of the present invention.

Referring to FIG. 2, while the remote devices 19 of the respective network devices 18 may be directly connected to the network bus 12, the network devices 18 of one advantageous embodiment include respective network device interface (NDI) elements 16 as described by U.S. patent application Ser. No. 09/735,146 entitled Network Device Interface for Digitally Interfacing Data Channels to a Controller Via a Network, filed Dec. 12, 2000, the contents of which are incorporated herein in their entirety. In this advantageous embodiment, each NDI element is disposed in electrical communication with the network bus for transmitting signals to the network bus and for receiving signals from the network bus. Each NDI element is also in communication with one or more remote devices via respective data channels. While each NDI element is shown to be connected to a single remote device in FIG. 1, the NDI element could be connected to two or more remote devices, if so desired.

As shown in FIG. 2 and described by U.S. patent application Ser. No. 09/735,146, each NDI element includes a processing element 22, a transceiver 24, a local oscillator 26 and at least one voltage regulator 28. The processing element can receive commands and instructions from the network bus 12 by way of the transceiver, and can transmit messages and data onto the network bus by way of the transceiver. Further, the processing element can transmit commands and instructions to the respective remote device, and can receive messages and data from the respective remote device.

The processing element is also capable of determining if clock signals are provided with messages received via the network bus from the network controller such that the processing element can determine if the network controller is operating in either the synchronous or asynchronous mode. In this regard, if the processing element determines that the network controller is operating in the synchronous mode, the transceiver can transmit messages at the same transmission rate as the network controller. And if the processing element determines that the network controller is operating in the asynchronous mode, the transceiver can transmit messages in an asynchronous mode. Also, whereas the transceiver can comprise any of a number of different transceivers, the transceiver of one advantageous embodiment comprises a low voltage differential signal (LVDS) transceiver to thereby limit the differential signal amplitude on the network bus. Although the NDI element preferably includes a transceiver that can both transmit and receive messages via the network bus, it should be understood that the transceiver can comprise separate transmitter and receiver elements for performing the respective functions. In addition to the processing element and the transceiver, the local oscillator drives the timing of the NDI element via the processing element. And the voltage regulator(s), in turn, regulate the power supplied to the NDI element.

As described by U.S. patent application Ser. No. 09/735,146, the NDI element 16 performs various functions to facilitate communications by the remote device 19 over the network bus 12. For example, the NDI element may store the data collected by the associated remote device(s) such that the stored data may be provided to the network controller 14 via the network bus upon request. If the remote device is an analog device, the NDI element may also convert signals between the digital format supported by the network bus and the analog format supported by the remote device. For purposes of explanation and not of limitation, however, the present invention will subsequently be described in terms of the network devices, which include respective remote devices and can additionally include associated network device interfaces.

Upon initialization of the network, the network controller 14 inventories the network devices 18 connected to the network bus 12 and reads a unique logical address to each network device so that the network controller can communicate with a specific network device or a specific group of network devices. A wide variety of techniques can be utilized to inventory the network devices connected to the network bus and to assign unique logical addresses to the network devices. One advantageous technique for inventorying the network devices and assigning unique logical addresses is the bit competition technique described by U.S. patent application Ser. No. 09/736,878, U.S. patent application Ser. No. 09/735,146 as well as Provisional U.S. Patent Application No. 60/286,793 entitled Systems and Methods for Assigning an Address to a Network Device Added to an Existing Network, filed Apr. 26, 2001, the contents of which are also incorporated herein in their entirety.

Again referring to FIG. 1, in operation, the network controller 14 issues various commands and respective network devices 18 respond based upon the commands. The network controller and the network devices can communicate according to any of a number of different protocols. As described in U.S. patent application Ser. No. 09/736,878, for example, the network controller and the network devices can communicate according to a Manchester-encoded bi-phase sensor and system (BiSenSys) protocol. Preferably, however, the protocol is selected to minimize the overhead and to correspondingly maximize the data transfer capability. Further, the protocol is preferably selected to be relatively simple such that neither the network devices nor the network device interface elements 18 will require a high level processor. Instead, the network controller and the associated host computer 20 can include the majority of the processing power and the NDI elements can include logic that is readily implemented in hardware, software or firmware.

The communications supported by the system 10 may also be either synchronous or asynchronous and may involve the transmission of various types of messages. As described by U.S. patent application Ser. No. 09/736,878, for example, one advantageous communications technique is based upon the transmission of message frames that include command frames and data frames having respective predetermined lengths or sizes. Depending upon the protocol, the system can also support various command sets. As with the protocol, the command set is preferably selected to minimize the overhead that must be transmitted via the network bus and to be relatively simple. One example of a suitable command set is described by U.S. patent application Ser. No. 09/735,146.

As stated, the network controller 14 and the network devices 18 can communicate according to a Manchester-encoded bi-phase sensor and system (BiSenSys) protocol. In this regard, Manchester encoded signals are square-wave signals that are quite simple to generate at the transmitter and require no complex matched filter at the receiver. However, the frequency spectrum of a Manchester encoded signal typically exhibits significant electromagnetic emissions at frequencies out to many times the fundamental frequency. For example, a 10 Mb/sec Manchester encoded data stream will exhibit significant electromagnetic emissions out to many times 10 MHz.

Further, circuitry within the system 10, particularly circuitry within the network devices 18, generate additional unwanted electromagnetic emissions that contribute significantly to the radiated emission spectra of the system. Both radiative and conductive coupling paths exist whereby such additional electromagnetic emissions can create undesirable common mode disturbances on the network bus 12, particularly when the network bus comprises unshielded differential twisted-pair of wires. In this regard, radiated emissions from the network bus between two or more network devices is the direct result of uncontrolled common mode and high frequency differential mode currents on the network bus. And as such, the degree to which radiated emissions are controlled is a direct result of how well common mode and high frequency differential mode currents can be controlled on the network bus.

Figure 3:
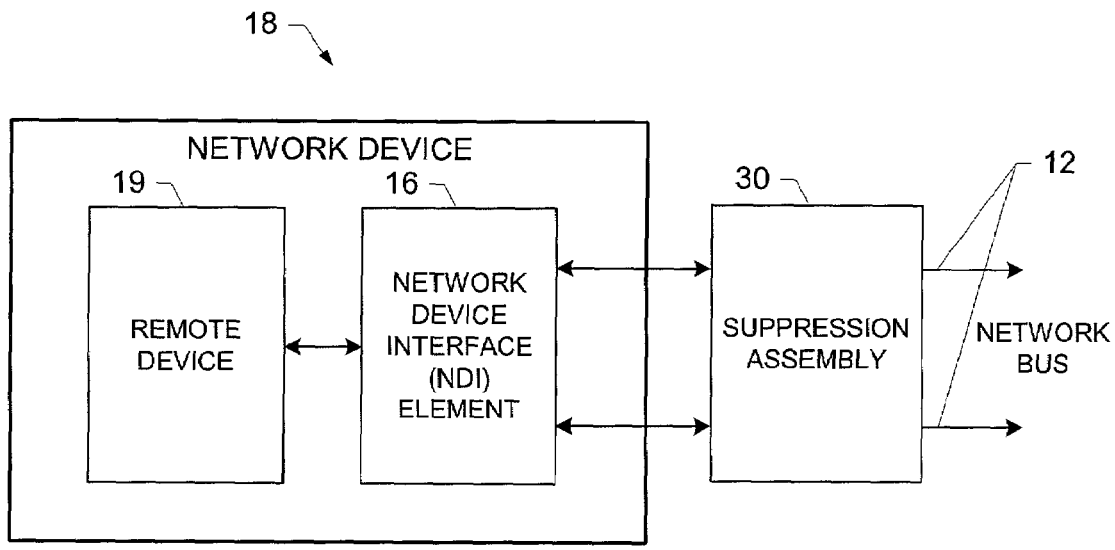
FIG. 3 is an exploded schematic block diagram illustrating various elements of a network device and a suppression assembly, according to one embodiment of the present invention.
Figure 4:
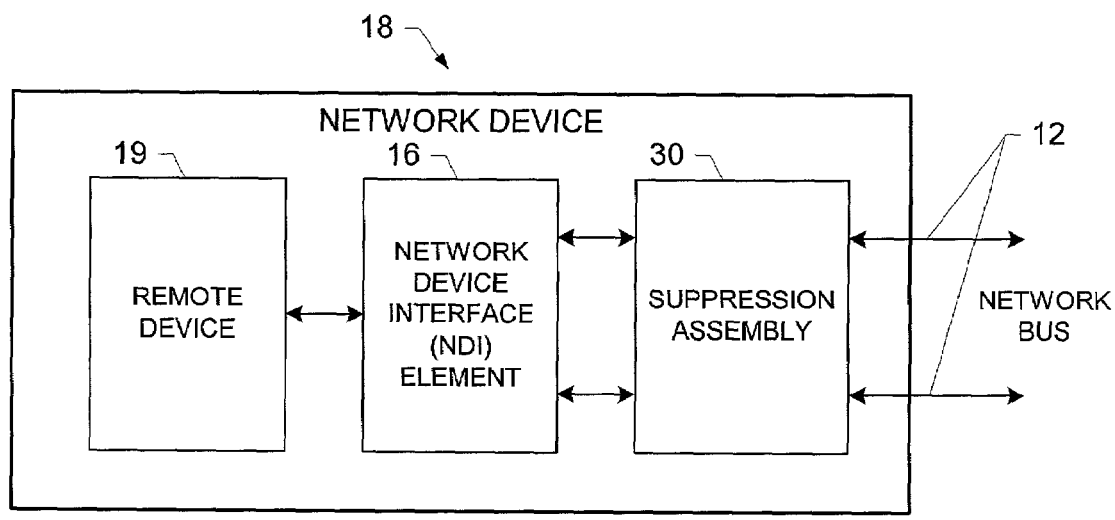
FIG. 4 is an exploded schematic block diagram illustrating various elements of a network device including the suppression assembly, according to one embodiment of the present invention.

To allow the system 10 to communicate at data rates of 10 Mb/sec or higher, while using the BiSenSys protocol, the present invention provides suppression assemblies 30 connected between the remote devices 19 and NDI elements 16, and the network bus 12. Each suppression assembly can be connected in any one of a number of different manners, such as between the respective network device 18 and the network bus (see FIG. 3), or connected within the respective network device between the NDI element and the network bus (see FIG. 4). But in a preferred embodiment, referring now to FIG. 5, each suppression assembly is connected within a respective NDI element between the transceiver 24 and the network bus.

As stated, to limit the differential signal amplitude to thereby limit radiated emissions on the network bus 12, the transceiver 24 preferably comprises an LVDS transceiver. In this regard, to further reduce and shape the low voltage of the transmissions from the transceiver, the suppression assembly 30 includes a broadband low pass filter 31. By shaping the transmissions from the transceiver, the low pass filter can attenuate at least a portion of the high frequency harmonics of the transmissions that can cause electromagnetic emissions from the system. The low pass filter can comprise any of a number of different elements as such are known but, in one embodiment, comprises an RC filter including at least one resistor and at least one capacitor. It should be understood that in removing a portion of the high frequency harmonics of the transmissions, the square-wave Manchester encoded signals will at least partially distort. In this regard, the passband of the low pass filter can be selected in any one of a number of different manners, but the passband should be selected broad enough that the transitions of the square-wave Manchester encoded signals can be received error free by the system. For example, the passband can be selected so as to include the fundamental frequency, as well as a portion of the third harmonic of the fundamental frequency. However, the passband can be selected to also include additional, higher harmonics as system energy levels allow.

Figure 6:
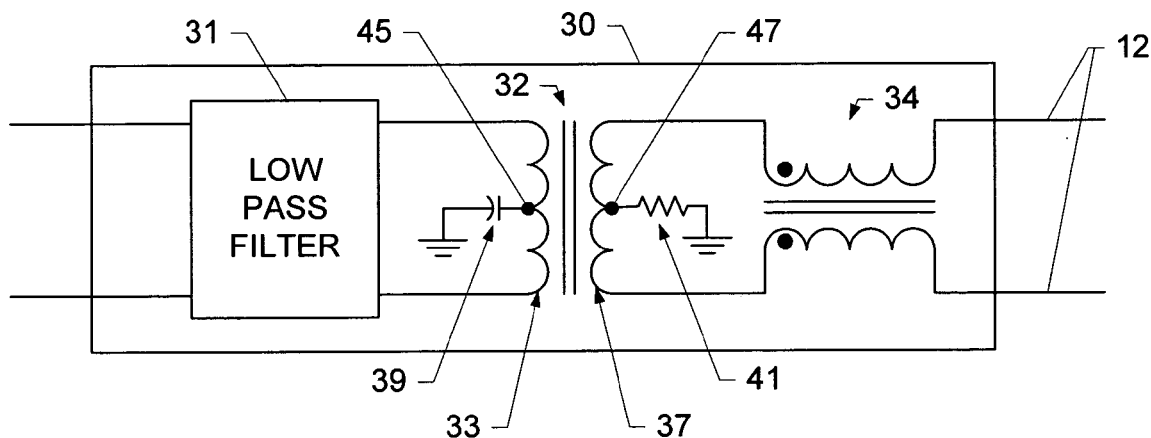
FIG. 6 is an exploded schematic block diagram illustrating various elements of the suppression assembly, according to one embodiment of the present invention.

Presuming a 10 Mb/sec data rate, as is typical in a communications system according to FIG. 1, the data transmitted to and received from the network bus 12 can cause emissions from approximately 150 kHz to approximately 50 MHz when two isolated NDI elements 16 are sharing a data stream and one NDI element's transceiver 24 sends data to and receives messages from the network bus at a slightly different average potential than the transceiver on the other NDI element. The resulting difference in average potential causes undesirable common mode currents in the network bus interconnecting the two NDI elements. As such, each suppression assembly 30 preferably includes an isolation element, such as an isolation transformer 32, as shown in FIG. 6. The isolation transformer can comprise any one of a number of devices, including a model 7159-30 transformer manufactured by Midcom, Inc. of Watertown, S. Dak. By including the isolation element, the isolation assembly can attenuate the undesirable common mode currents in the network bus at frequencies between approximately 150 kHz and approximately 50 MHz.

At frequencies above 50 MHz, most electromagnetic emissions from the system 10 are related to the frequency and harmonics of the local oscillator 26 of the NDI element 16. In this regard, because the local oscillator drives the timing for the NDI element, several coupling paths can exist for such electromagnetic emissions to reach the network bus 12 as a common mode disturbance. In addition, at frequencies above 50 MHz, the ability of the isolation transformer 32 to attenuate such electromagnetic emissions, or radio frequency common mode currents, becomes negligible due to inter-winding capacitance of the isolation transformer. Therefore, to further limit the level of the electromagnetic emissions, particularly at frequencies above 50 MHz, the suppression assembly 30 preferably includes an attenuation element located between the isolation element and the network bus 12. The attenuation element can be located at any location between the isolation element and the network bus but, in a preferred embodiment, the attenuation element is located as close as possible to the network bus while remaining within the NDI element. As such, inductive cross-talk that can lend itself to coupling between loops on the NDI element can be limited.

The attenuation element can comprise any of a number of different elements that attenuate common mode currents by at least a predetermined level at frequencies above that which the isolation element can adequately attenuate, such as by attenuating the common mode currents by at least 30 decibels (dB) at frequencies up to 1 GHz. For example, the attenuation element can comprise a common mode choke 44 (illustrated in FIG. 6), such as a model PE-68624 choke manufactured by Pulse Engineering, Inc. of San Diego, Calif. Whereas the isolation element and attenuation element are described as separate elements, it should be understood that the isolation element and attenuation element can be embodiment in a single device without departing from the spirit and scope of the present invention.

As shown in FIG. 6, in embodiments where the isolation element comprises an isolation transformer, the isolation transformer can include primary and secondary coils 33 and 37, respectively, with the primary coil located proximate a respective network device 18 and the secondary coil located proximate the network bus 12. The primary coil can include a primary center tap 45, and the secondary coil can include a secondary center tap 47. In this regard, the suppression assembly can further include a low impedance capacitor 39 and a resistor 41. The capacitor is connected between the primary center tap and ground, and acts to short any common mode noise in the isolation transformer to ground, while allowing a DC common mode signal to exist on the data lines between the transformer primary coil and the transceiver 24. The resistor 41 is placed between the secondary center tap and ground and, as such, the resistor can provide a lossy path for any common mode standing wave that may build up in amplitude on the network bus. The resistance of the resistor can be any one of a number of different values but, preferably, the resistance is chosen to be between 50 and 200 Ohms.

In addition to the suppression assembly 30, a number of additional suppression methods can be implemented to further limit the electromagnetic emissions from the NDI elements 16 and, thus, the system 10. For example, a power conditioning filter 21 can be placed at the output of the voltage regulator(s) 28 to remove any high frequency noise that the voltage regulator(s) and/or the power source providing power to the NDI element may emit that would otherwise be transferred to the other components of the NDI element, particularly the transceiver 24. In this regard, the power conditioning filter can comprise any of a number of known configurations, but in one embodiment comprises at least two noise suppression assemblies. The first assembly can include a capacitor 52 in series with a resistor 51, as shown symbolically in FIG. 7 connected between a power layer 38 and a ground layer 36 of a printed circuit board (PCB) embodiment of the NDI element, described below. The capacitor is chosen to have a low impedance to the noise being suppressed, and the resistor is chosen to have a low value of resistance, such as 0.1 Ohms. The first noise suppression assembly dissipates noise energy in the event that the power to the NDI elements should become resonant for any reason. The second noise suppression assembly blocks noise in the power from getting to the transceiver, and can comprise any of a number of different configurations, as described below.

Figure 5:
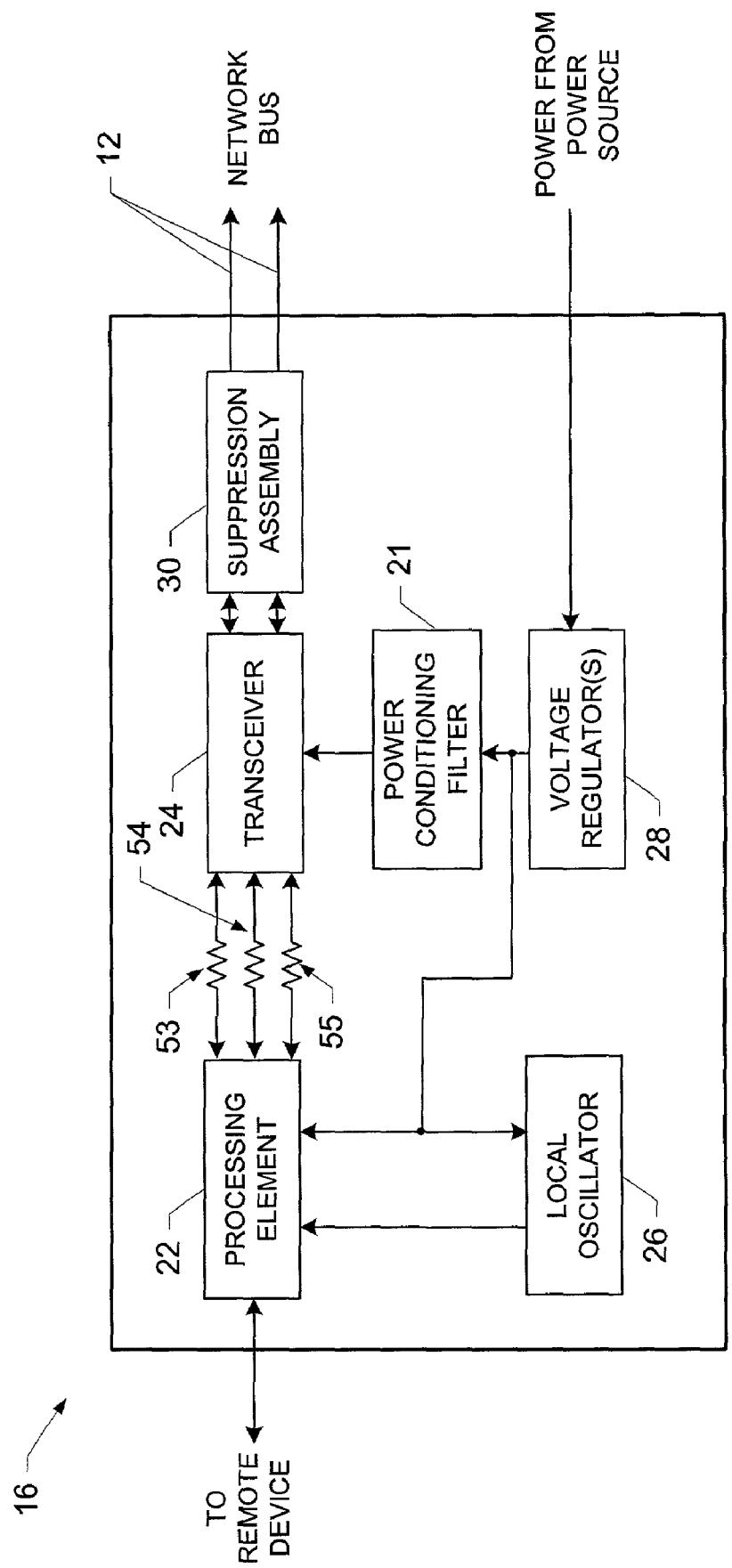
FIG. 5. is an exploded schematic block diagram illustrating various elements of the network device interface element including the suppression assembly and a power conditioning filter, according to one embodiment of the present invention.

In addition to the power conditioning filter 21, one or more additional resistors can be electrically connected between the processing element 22 and the transceiver 24 to limit the switching currents of transmissions to and from the transceiver. For example, as shown in FIG. 5, in embodiments where the network bus comprises differential twisted-pair wires, the transceiver typically transmits and receives logic signals to and from the processing element. Resistors, 53, 54 and 55 can be placed in series with the paths of transmission of each of these logic signals between the processing element and the transceiver to limit how quickly the logic signals can switch. The value of the additional resistors can be selected in any one of a number of manners. For example, when the transceiver is embodied in an integrated circuit, the resistors are preferably selected based on the capacitance of the transceiver pin being switched and the frequency of the transmissions to and from the transceiver. As such, for a 10 Mbit/sec transmission rate with a low pico-Farad capacitance, the value of the resistors can be selected to be approximately 200 Ohms. Further details of systems and methods for reducing electromagnetic emissions in the system can be found in U.S. patent application Ser. No. 10/076,188, entitled: System Having a Spread-Spectrum Clock for Further Suppression of Electromagnetic Emissions in Network Devices Communicating Via a Network Bus, filed concurrently herewith, and incorporated by reference herein in its entirety.

Figure 7:
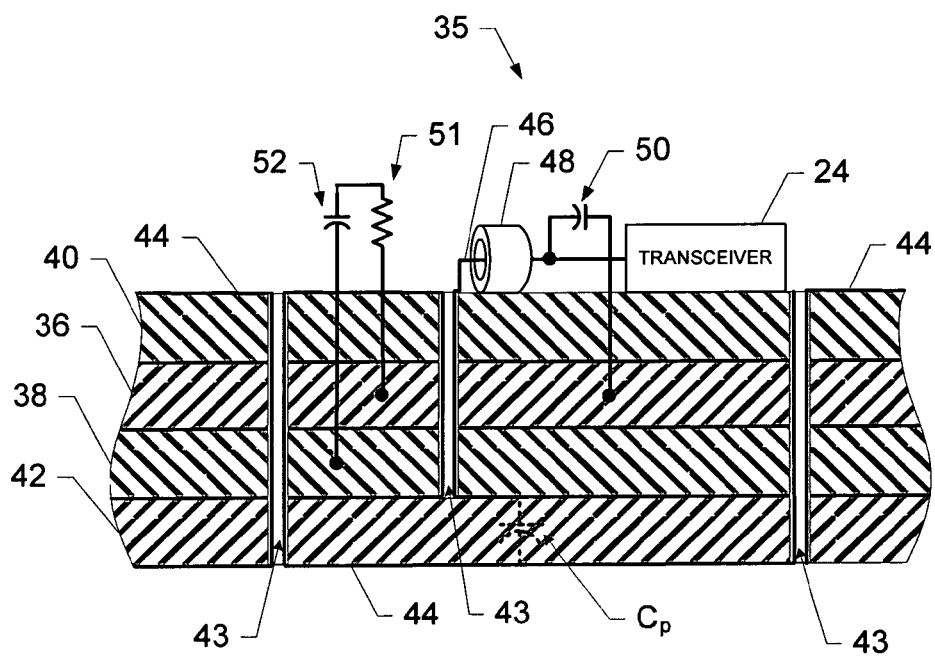
FIG. 7 is a schematic diagram of a portion of the network device interface element where the network device interface element is embodied in a multi-layer printed circuit board.

Further, to at least partially shield the network bus 12 and surroundings from electromagnetic emissions from the NDI element 16, the NDI elements are each preferably encased in a radio frequency shielding enclosure, which can be made of any of a number of different shielding materials such as copper, aluminum, stainless steels, or ferromagnetic steels. In this regard, the NDI element is typically comprised of the various elements as depicted in FIG. 2, and a printed circuit board (PCB) 35 upon which the elements are mounted. For example, the processing element can be mounted upon the PCB by means of a ball-grid array to make appropriate electrical connections therewith. As shown in FIG. 7, to achieve small spacing between balls in a ball-grid array, in one preferred embodiment the NDI element 16 is configured on a multi-layer PCB, with the layers including a ground layer 36 and a power layer 38, both sandwiched between signal layers 40 and 42. By configuring the NDI element in a multi-layer PCB, the inductive and capacitive cross-talk that can allow noise to be injected on the signal lines between the suppression assembly and the network bus 12 can be reduced to allowable levels.

To configure the PCB 35, vias 43 can extend between the layers such that conductive traces 44 can route necessary electrical connections between the layers. In this regard, the conductive traces can route signals onto the signal layer 42 located adjacent the power layer 38. But routing the signals between the layers onto the signal layer 42 located adjacent the power plane can cause some radio frequency energy to capacitively couple (designated $C_p$) onto the power layer. Such capacitive coupling can create an undesirable common mode current source at the transceiver 24 between the transceiver and the power plane providing power to the transceiver via conductive trace 46.

As previously stated, the second noise suppression assembly blocks noise in the power from getting to the transceiver. In this regard, the second noise suppression assembly can be connected to conductive trace 46 between the transceiver and the power layer. For example, in one embodiment, the second noise suppression assembly comprises an inductance increasing element, such as a ferrite chip bead 48, placed around conductive trace 46 between the transceiver and the power layer. Additionally, as symbolically shown in FIG. 7, a capacitor 50 can be connected between the ferrite chip bead and the ground layer 36. Although shown connected to the respective layers symbolically, the capacitors 50 and 52, as well as the resistor 51, would typically be connected in the same manner as the other interconnections in the PCB, namely by way of conductive traces extending through vias. In another embodiment (not shown), the second noise suppression assembly comprises a low pass LC filter network, including at least one inductor and at least one capacitor, which limits the amount of power supply noise reaching the transceiver. Also, to further limit the undesirable common mode current, the power layer can be configured such that the power layer does not extend underneath the transceiver and/or the isolation assembly 30.

Electromagnetic fields generated on the surface of the PCB 35 are naturally coupled to the inside of the radio frequency shielding enclosure. In this regard, the enclosure typically includes a body and a cover for accessing the PCB. And although the enclosure is designed to shield unwanted signals from escaping the enclosure, manufacturing tolerances of the enclosure can cause gaps between the body and the cover. Such gaps, in turn, can result in emissions radiating directly from the enclosure, particularly when the transmission frequency rises above 240 MHz where the enclosure dimensions are a significant fraction of the wavelength. As such, at least one grounding element, such as a ground strap, solder land or the like, is preferably connected from at least one edge of the PCB to the inside of the enclosure to thereby limit the level of emissions to an acceptable level. In this regard, conductive traces can extend through vias to connect the grounding elements to the ground layer 36 of the PCB at the signal layers 40 and 42. The grounding elements are connected from the edges of the PCB because the desired reduction in emissions is preferably made at the point where the network bus 12 extends from the PCB.

The network system and network device interface element of the present invention allow for communications at transmission rates up to 12.5 Mb/sec, while limiting electromagnetic emissions from the network system and network device interface element to at or below stringent standards, such as those instituted in the automotive and aircraft industries. Moreover, the present invention allows for such high speed communication rates at or below the stringent standards, while operating with a network bus comprising an unshielded twisted-pair cable.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A network system comprising:
    a network comprising:
        a network bus electrically connected to at least one network device; and
        a network controller for directing conummications with the at least one network device via said network bus, wherein said network controller is capable of selectively operating in either mode selected from the group consisting of a synchronous mode and an asynchronous mode; and
    at least one suppression assembly electrically connected between said network bus and respective network devices, wherein each suppression assembly is capable of limiting electromagnetic emissions from the respective network devices communicating via said network bus, and wherein each suppression assembly comprises:
        an isolation transformer including a primary coil located proximate a respective network device and a secondary coil located proximate said network bus, wherein the primary coil and secondary coil include a primary center tap and a secondary center tap, respectively; and
        a resistor electrically connected between the secondary center tap and a ground.

2. A network system according to claim 1, wherein said network bus comprises unshielded differential twisted-pair wire, and wherein each suppression assembly comprises an isolation transformer.

3. A network system according to claim 1, wherein each suppression assembly further comprises:
    a low impedance capacitor electrically connected between the primary center tap and the ground.

4. A network system according to claim 2, wherein the at least one suppression assembly further comprises a common mode choke electrically connected between said isolation transformer and said network bus.

5. A network system according to claim 4, wherein the at least one suppression assembly further comprises a low pass filter electrically connected between said transceiver and said isolation transformer.

6. A network system according to claim 1, wherein the at least one network device is capable of transmitting and receiving messages via said network bus, wherein the at least one suppression assembly includes a low pass filter capable of removing at least one high frequency component from the messages.

7. A network system according to claim 1, wherein each network device comprises a remote device, and a network device interface element electrically connected between said network bus and respective remote devices, wherein each suppression assembly is electrically connected between a respective network device interface element and said network bus.

8. A network system according to claim 7, wherein each network device interface element comprises:
    a transceiver for transmitting and receiving messages via said network bus; and
    a processing element for providing commands to the respective remote device in response to messages received by said transceiver and for receiving data from the associated remote device.

9. A network system according to claim 8, wherein each suppression assembly is embodied within a respective network device interface element, wherein each suppression assembly is electrically connected between the transceiver of the respective network device interface element and said network bus, and wherein each suppression assembly is capable of at least partially limiting electromagnetic emissions from the transceiver of the respective network device interface element.

10. A network system according to claim 8 further comprising at least one resistor electrically connected between said transceiver and said processing element to thereby limit noise generated by said transceiver.

11. A network system comprising:
    a network comprising:
        a network bus electrically connected to a plurality of remote devices; and
        a network controller for digitally directing transmissions with the plurality of remote devices via said network bus; and
    a plurality of network device interface elements adapted to interconnect said network controller with respective remote devices via said network bus, each network device interface element including a suppression assembly capable of at least partially limiting electromagnetic emissions from at least one of the respective network device interface element and the respective remote device, wherein each suppression assembly comprises an isolation transformer, wherein each network device interface element is capable of transmitting and receiving messages via said network bus, wherein said network device interface element is capable of determining if clock signals are provided with messages received via said network bus such that said network device inteitce element is capable of transmitting messages in either mode selected from the group consisting of a synchronous mode and an asynchronous mode based upon the determination.

12. A network system according to claim 11, wherein each network device interface element further includes:
    a transceiver capable of transmitting and receiving messages via said network bus; and
    a processing element for providing commands to the associated remote device in response to messages received by said transceiver and for receiving data from the associated remote device, wherein said suppression assembly is electrically connected between said transceiver and said network bus, and wherein said suppression assembly is capable of at least partially limiting electromagnetic emissions from said transceiver and said processing element.

13. A network system according to claim 11, wherein said network bus comprises unshielded differential twisted-pair wires.

14. A network system according to claim 13, wherein each isolation transformer includes a primary coil located proximate a respective transceiver and a secondary coil located proximate said network bus, wherein the primary coil and secondary coil include a primary center tap and a secondary center tap, respectively, and wherein each suppression assembly further comprises:
   a low impedance capacitor electrically connected between the primary center tap and a ground; and
   a resistor electrically connected between the secondary center tap and the ground.

15. A network system according to claim 13, wherein each suppression assembly comprises a common mode choke electrically connected between said isolation transformer and said network bus.

16. A network system according to claim 15, wherein each suppression assembly further comprises a low pass filter electrically connected between said transceiver and said isolation transformer.

17. A network system according to claim 11, wherein each remote device is capable of transmitting and receiving messages via said network bus through a respective network device interface element, and wherein each suppression assembly includes a low pass filter capable of removing at least one high frequency component from the messages transmitted and received via said network bus.

18. A network system according to claim 11, wherein each network device interface element is embodied in a printed circuit board comprising a plurality of layers, said network system further comprising a plurality of shielding enclosures each defining an internal cavity, wherein each printed circuit board is contained within the internal cavity defined by a respective shielding enclosure such that the respective shielding enclosure is capable of preventing at least a portion of electromagnetic emissions from the respective printed circuit board from escaping the internal cavity.

19. A network system according to claim 18, wherein each shielding enclosure includes at least one grounding element electrically connected between at least one edge of the respective printed circuit board and said shielding enclosure.

20. A network system according to claim 18, wherein the plurality of layers of the printed circuit board includes at least one signal layer and a power layer, wherein the printed circuit board defines at least one via between at least two layers to electrically connect a conductive trace on a signal layer extending from said transceiver with the power layer, and wherein each network device interface element further comprises a noise suppression assembly electrically connected to the conductive trace extending from said transceiver on the signal layer.

21. A network system according to claim 20, wherein said noise suppression assembly comprises at least one of a ferrite chip bead connected to a capacitor, and an LC low pass filter network.

22. A network system according to claim 18, wherein the plurality of layers of the printed circuit board includes a power layer and a ground layer, said network system further comprising a damping resistor and a capacitor, wherein said damping resistor and capacitor are connected in series with one another and electrically connected between the power layer and the ground layer such that said damping resistor and capacitor can provide a lossy path for noise on the power layer.

23. A network device interface element adapted to interconnect a network controller with an associated remote device via a network bus, the network device interface element comprising:
   a transceiver capable of transmitting and receiving messages via the network bus;
   a processing element for providing commands to the associated remote device in response to messages received by said transceiver and for receiving data from the associated remote device, wherein said network device interface element is capable of determining if clock signals are provided with messages received by said transceiver such that the network device interface is capable of transmitting messages in either mode selected from the group consisting of a synchronous mode and an asynchronous mode based upon the determination; and
   a suppression assembly electrically connected between said transceiver and the network bus, said suppression assembly being capable of at least partially limiting electromagnetic emissions from said transceiver and processing element, wherein said suppression assembly comprises an isolation transformer.

24. A network device interface element according to claim 23, wherein the network bus comprises unshielded differential twisted-pair wires.

25. A network device interface element according to claim 24, wherein said suppression assembly further comprises a common mode choke electrically connected to the network bus between said isolation transformer and the network bus.

26. A network device interface element according to claim 25, wherein said suppression assembly further comprises a low pass filter electrically connected between said transceiver and said isolation transformer.

27. A network device interface element according to claim 23 further comprising a local oscillator capable of controlling a rate at which said transceiver transmits and receives messages, wherein said suppression assembly comprises a common mode choke capable of at least partially limiting electromagnetic emissions from said transceiver, processing element and local oscillator.

28. A network device interface element according to claim 23, wherein said suppression assembly includes a low pass filter capable of removing at least one high frequency component of messages transmitted received and transmitted via the network bus.

29. A network device interface element according to claim 23, wherein said transceiver, processing element and suppression assembly are embodied in a printed circuit board comprising a plurality of layers, said network device interface element further comprising a shielding enclosure defining an internal cavity, wherein the printed circuit board is contained within the internal cavity defined by said shielding enclosure such that said shielding enclosure is capable of preventing at least a portion of electromagnetic emissions from said transceiver, processing element and suppression assembly from escaping the internal cavity.

30. A network device interface element according to claim 29 further comprising at least one grounding element electrically connected between at least one edge of the printed circuit board and said shielding enclosure.

31. A network device interface element according to claim 29, wherein the plurality of layers of the printed circuit board includes at least one signal layer and a power layer, wherein the printed circuit board defines at least one via between at least two layers to electrically connect a conductive trace on a signal layer extending from said transceiver with the power layer, and wherein the network device interface element further comprises a ferrite chip bead electrically connected to the conductive trace extending from said transceiver on the signal layer.

32. A network device interface element adapted to interconnect a network controller with an associated remote device via a network bus, the network device interface element comprising:

a transceiver capable of transmitting and receiving messages via the network bus;

a processing element for providing commands to the associated remote device in response to messages received by said transceiver and for receiving data from the associated remote device, wherein said network device interface element is capable of determining if clock signals are provided with messages received by said transceiver such that the network device interface is capable of transmitting messages in either mode selected from the group consisting of a synchronous mode and an asynchronous mode based upon the determination; and a suppression assembly adapted to at least partially limit electromagnetic emissions from said transceiver and said processing element, said suppression assembly comprising:

an isolation transformer;

a common mode choke electrically connected to the network bus between said isolation transformer and the network bus; and a low pass filter electrically connected between said transceiver and said isolation transformer.

33. A network device interface element according to claim 32, wherein the network bus comprises unshielded differential twisted-pair wires.

34. A network device interface element according to claim 32 further comprising:

a local oscillator capable of controlling a rate at which said transceiver transmits and receives messages; and at least one voltage regulator capable of regulating power provided to said transceiver, said processing element and said local oscillator.

35. A network device interface element according to claim 34 further comprising a power conditioning filter electrically connected between said at least one voltage regulator and said transceiver, said processing element and said local oscillator, wherein said power conditioning filter is capable of limiting high frequency noise emitted from said at least one voltage regulators.

* * * * *

UNITED STATES PATENT AND TRADEMARK OFFICE
CERTIFICATE OF CORRECTION

PATENT NO.       : 7,065,583 B2                                              Page 1 of 1
APPLICATION NO.  : 10/076063
DATED            : June 20, 2006
INVENTOR(S)      : Konz et al.

It is certified that error appears in the above-identified patent and that said Letters Patent is hereby corrected as shown below:

Column 6,
Line 59, "fuction" should read --function--.

Column 13,
Line 31, "conummications" should read --communications--;
Line 54, "wire" should read --wires--.

Column 14,
Line 58, "inteitce" should read --interface--.

Column 16,
Line 44, "clement" should read --element--.

Signed and Sealed this

Twelfth Day of December, 2006

JON W. DUDAS
*Director of the United States Patent and Trademark Office*